United States Patent
Vijayasankar et al.

(10) Patent No.: US 9,203,757 B2
(45) Date of Patent: Dec. 1, 2015

(54) NETWORK THROUGHPUT USING MULTIPLE REED-SOLOMON BLOCKS

(71) Applicant: Texas Instruments Incorporated, Dallas, TX (US)

(72) Inventors: Kumaran Vijayasankar, Dallas, TX (US); Tarkesh Pande, Dallas, TX (US); Ramanuja Vedantham, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 220 days.

(21) Appl. No.: 13/848,054

(22) Filed: Mar. 20, 2013

(65) Prior Publication Data

US 2013/0254615 A1    Sep. 26, 2013

Related U.S. Application Data

(60) Provisional application No. 61/614,307, filed on Mar. 22, 2012.

(51) Int. Cl.

| | |
|---|---|
| *H03M 13/00* | (2006.01) |
| *H04L 12/801* | (2013.01) |
| *H04L 1/08* | (2006.01) |
| *H03M 13/09* | (2006.01) |
| *H04L 1/00* | (2006.01) |
| *H04B 3/54* | (2006.01) |
| *H04L 1/16* | (2006.01) |

(52) U.S. Cl.
CPC ............. *H04L 47/10* (2013.01); *H03M 13/09* (2013.01); *H04B 3/542* (2013.01); *H04L 1/0057* (2013.01); *H04L 1/0061* (2013.01); *H04L 1/0071* (2013.01); *H04L 1/08* (2013.01); *H04B 2203/5408* (2013.01); *H04L 1/1607* (2013.01)

(58) Field of Classification Search
CPC ....... H04L 1/08; H04L 1/0076; H03M 13/09; H03M 13/1515
See application file for complete search history.

(56) References Cited

U.S. PATENT DOCUMENTS

| | | | | |
|---|---|---|---|---|
| 7,277,505 | B2 * | 10/2007 | Fimoff ........................ | 375/340 |
| 7,630,456 | B2 * | 12/2009 | Mogre et al. .................. | 375/308 |
| 7,849,380 | B2 * | 12/2010 | Markman et al. ............. | 714/760 |
| 8,115,605 | B2 * | 2/2012 | Macaluso et al. .......... | 340/12.32 |
| 8,121,232 | B2 * | 2/2012 | Lee et al. ...................... | 375/346 |
| 8,127,206 | B2 * | 2/2012 | Singh et al. .................. | 714/769 |
| 8,238,381 | B2 * | 8/2012 | Bretl et al. ................... | 370/535 |
| 8,446,987 | B2 * | 5/2013 | Azenkot et al. .............. | 375/340 |
| 8,640,001 | B2 * | 1/2014 | Bretl et al. ................... | 714/755 |

* cited by examiner

*Primary Examiner* — Esaw Abraham

(74) *Attorney, Agent, or Firm* — Steven A. Shaw; Charles A. Brill; Frank D. Cimino

(57) ABSTRACT

Embodiments of methods and systems are presented for generating PHY frames with multiple Reed-Solomon encoded blocks in PLC networks. In one embodiment, a MAC layer divides a data frame from a higher level into data blocks. The MAC layer may add a MAC header and/or an error-detection code to each data block. The MAC layer then passes the data blocks to a PHY layer to be individually Reed-Solomon encoded and combined into a single PHY frame for transmission on a PLC network. In other embodiments, the MAC layer passes a single data frame to the PHY layer, which divides the MAC data frame into segments to be individually Reed-Solomon encoded. The individual Reed-Solomon encoded segments are combined into a single PHY frame for transmission on a PLC network.

6 Claims, 5 Drawing Sheets

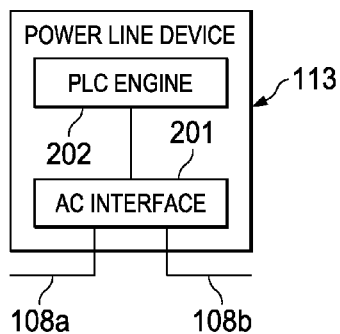
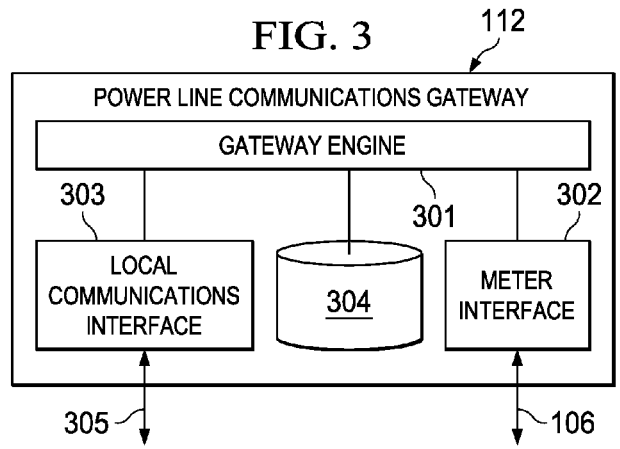
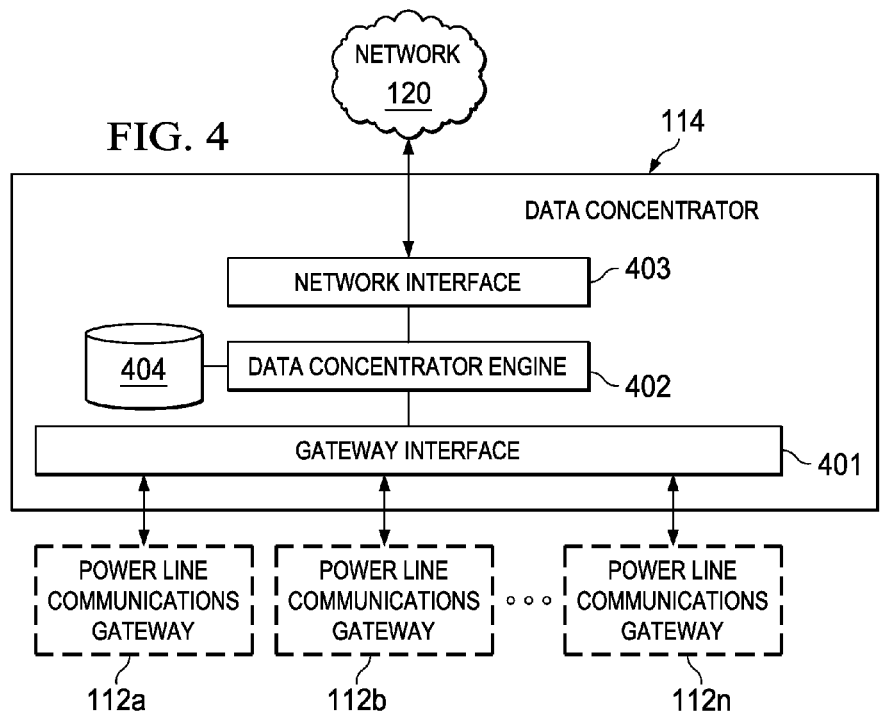

NETWORK THROUGHPUT USING MULTIPLE REED-SOLOMON BLOCKS

CROSS-REFERENCE TO RELATED APPLICATIONS

This application claims the benefit of the filing date of U.S. Provisional Patent Application No. 61/614,307, which is titled "Network Throughput Using Multiple RS-Block Transmission" and was filed on Mar. 22, 2012, the disclosure of which is hereby incorporated by reference herein in its entirety.

BACKGROUND

Power line communications (PLC) include systems for communicating data over the same medium that is also used to transmit electric power to residences, buildings, and other premises, such as wires, power lines, or other conductors. In its simplest terms, PLC modulates communication signals over existing power lines. This enables devices to be networked without introducing any new wires or cables. This capability is extremely attractive across a diverse range of applications that can leverage greater intelligence and efficiency through networking. PLC applications include utility meters, home area networks, and appliance and lighting control.

PLC is a generic term for any technology that uses power lines as a communications channel. Various PLC standardization efforts are currently in work around the world. The different standards focus on different performance factors and issues relating to particular applications and operating environments. Two of the most well-known PLC standards are G3 and PRIME. G3 has been approved by the International Telecommunication Union (ITU). IEEE is developing the IEEE P1901.2 standard that is based on G3. Each PLC standard has its own unique characteristics.

Using PLC to communicate with utility meters enable applications such as Automated Meter Reading (AMR) and Automated Meter Infrastructure (AMI) communications without the need to install additional wires. Consumers may also use PLC to connect home electric meters to an energy monitoring device or in-home display monitor their energy consumption and to leverage lower-cost electric pricing based on time-of-day demand.

As the home area network expands to include controlling home appliances for more efficient consumption of energy, OEMs may use PLC to link these devices and the home network. PLC may also support home and industrial automation by integrating intelligence into a wide variety of lighting products to enable functionality such as remote control of lighting, automated activation and deactivation of lights, monitoring of usage to accurately calculate energy costs, and connectivity to the grid.

The manner in which PLC systems are implemented depends upon local regulations, characteristics of local power grids, etc. The frequency band available for PLC users depends upon the location of the system. In Europe, PLC bands are defined by the CENELEC (European Committee for Electrotechnical Standardization). The CENELEC-A band (3 kHz-95 kHz) is exclusively for energy providers. The CENELEC-B, C, D bands are open for end user applications, which may include PLC users. Typically, PLC systems operate between 35-90 kHz in the CENELEC A band using 36 tones spaced 1.5675 kHz apart. In the United States, the FCC has conducted emissions requirements that start at 535 kHz and therefore the PLC systems have an FCC band defined from 154-487.5 kHz using 72 tones spaced at 4.6875 kHz apart. In other parts of the world different frequency bands are used, such as the Association of Radio Industries and Businesses (ARIB)-defined band in Japan, which operates at 10-450 kHz, and the Electric Power Research Institute (EPRI)-defined bands in China, which operates at 3-90 kHz.

SUMMARY OF THE INVENTION

Embodiments of methods and systems for improving overall network throughput using multiple RS-blocks in PLC networks are presented. In one embodiment, multiple RS-blocks are transmitted in a single packet transmission. This is especially advantageous when large data packet sizes need to be transmitted and the channel condition is good, thereby allowing for higher modulation constellations to be used. One such example is in medium communication links in a power line communication topology. For example, using existing power-line communication standards, such as IEEE, P1901.2, only a single RS-block may be transmitted per packet transmission. However, this leaves excess symbols available that are not used. Throughput can be increased by increasing the number of multiple RS-blocks per packet transmission.

BRIEF DESCRIPTION OF THE DRAWINGS

Figure 1:
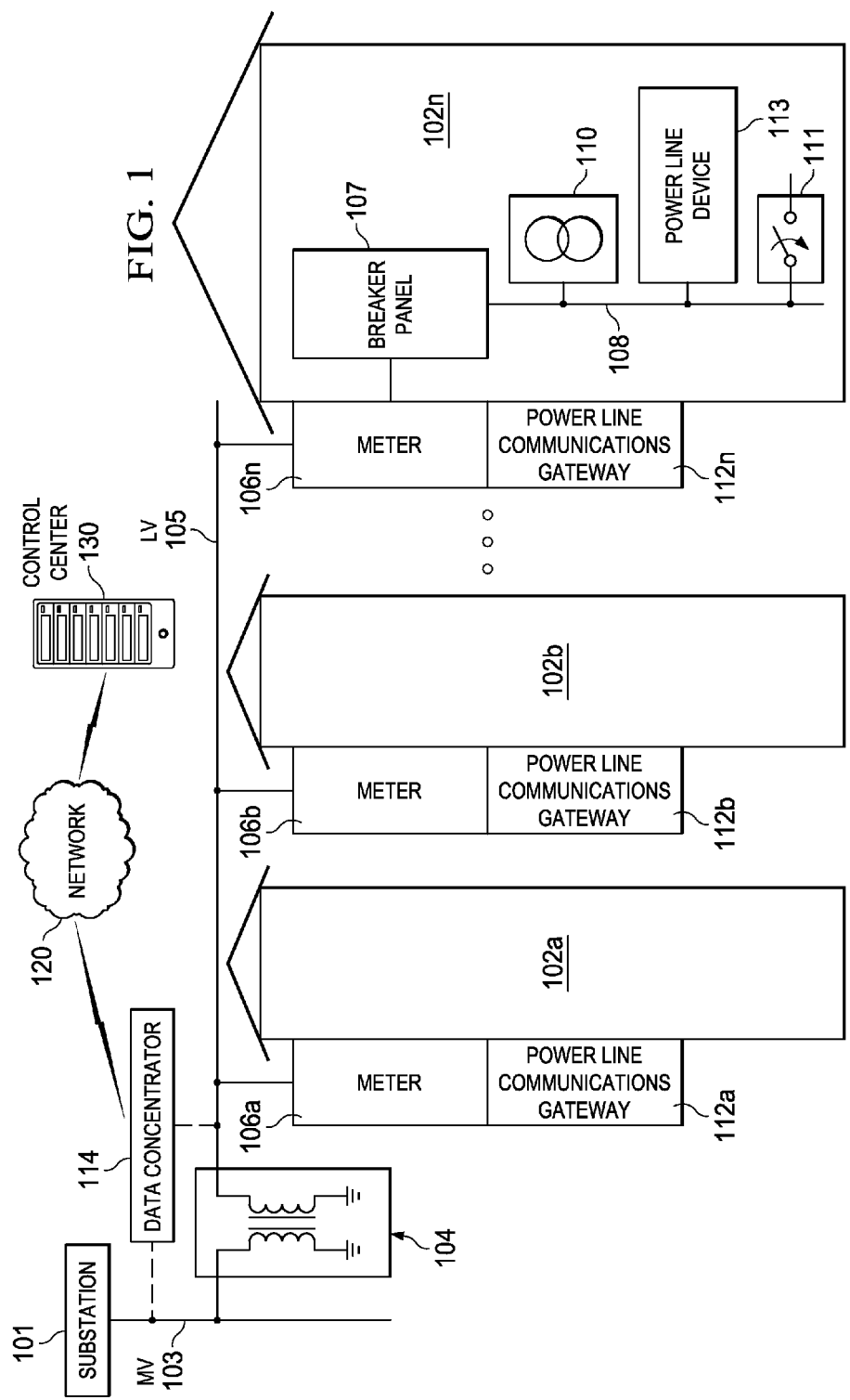

Having thus described the invention in general terms, reference will now be made to the accompanying drawings, wherein:

FIG. 1 is a diagram of a PLC system according to some embodiments.

FIG. 2 is a block diagram of a PLC device or modem according to some embodiments.

FIG. 3 is a block diagram of a PLC gateway according to some embodiments.

FIG. 4 is a block diagram of a PLC data concentrator according to some embodiments.

Figure 5:
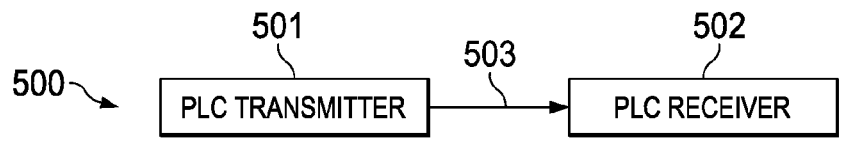

FIG. 5 is a schematic block diagram illustrating one embodiment of a system configured for point-to-point PLC.

Figure 6:
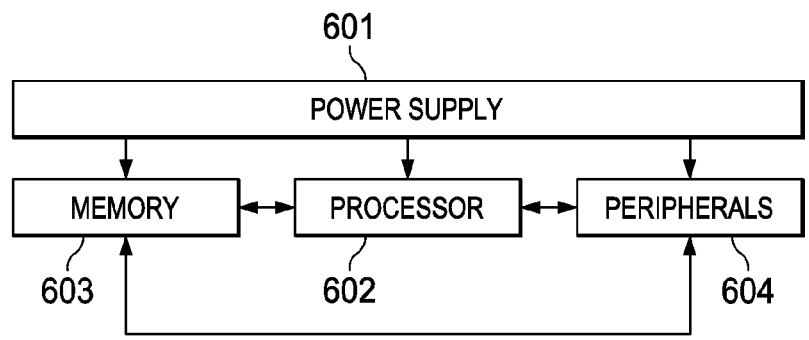

FIG. 6 is a block diagram of a circuit for generating PHY frames for a PLC network according to some embodiments, where the PHY frames have multiple Reed-Solomon encoded blocks.

Figure 7:
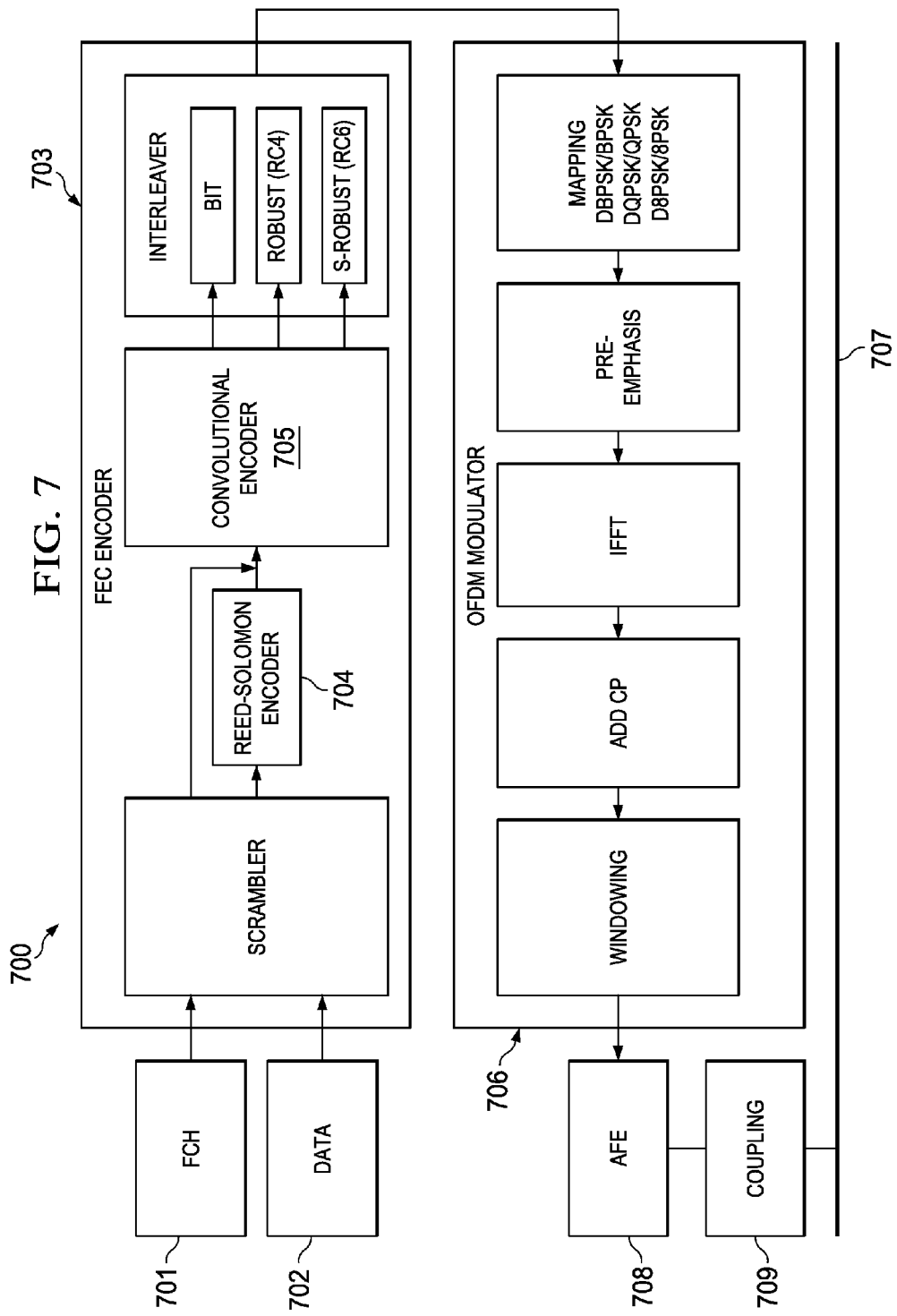

FIG. 7 is a high level block diagram of an OFDM transmitter for generating OFDM packets according to one embodiment.

Figure 8:
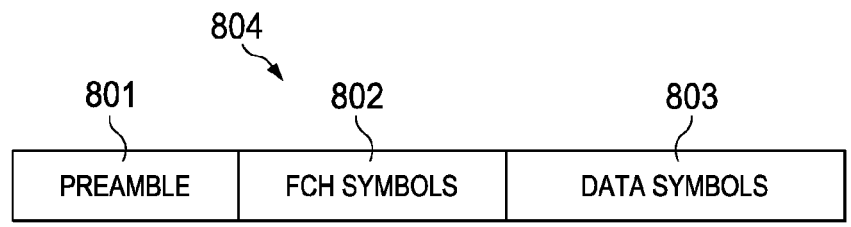

FIG. 8 illustrates a typical OFDM transmission packet comprising a preamble, frame control header (FCH) symbols, and data payload symbols.

Figure 9:
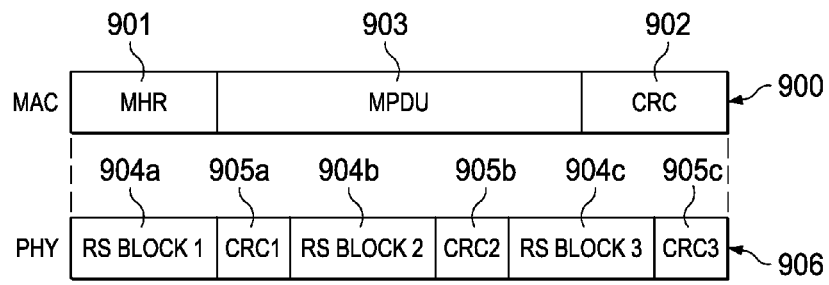

FIG. 9 illustrates a MAC to PHY frame transmission for the case where a MAC header is present only in the first RS-block.

Figure 10:
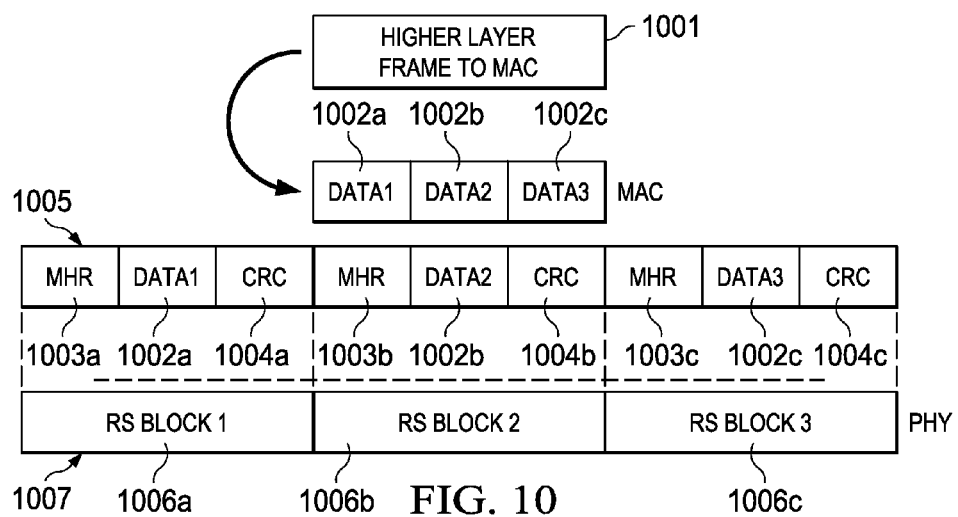

FIG. 10 illustrates a MAC to PHY frame transmission for the case where the MAC splits the data into multiple RS-blocks.

Figure 11:
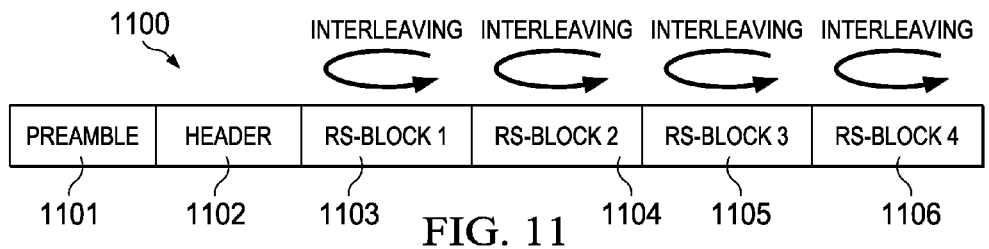

FIG. 11 illustrates data transmission with four RS-blocks according to one embodiment.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

The PLC standards provide for OFDM transmission of packets using Reed Solomon encoding. Embodiments of the present invention are directed to increasing the number of RS-blocks transmitted per data packet. An example of such a system is described below in FIGS. 7-11. FIGS. 1-6 describe PLC systems and methods generally.

FIG. 1 illustrates a power line communication system having overlapping priority contention windows in G3-PLC networks according to some embodiments. Medium voltage (MV) power lines 103 from substation 101 typically carry voltage in the tens of kilovolts range. Transformer 104 steps the MV power down to low voltage (LV) power on LV lines 105, carrying voltage in the range of 100-240 VAC. Transformer 104 is typically designed to operate at very low frequencies in the range of 50-60 Hz. Transformer 104 does not typically allow high frequencies, such as signals greater than 100 KHz, to pass between LV lines 105 and MV lines 103. LV lines 105 feed power to customers via meters 106a-n, which are typically mounted on the outside of residences 102a-n. Although referred to as "residences," premises 102a-n may include any type of building, facility, electric vehicle charging station, or other location where electric power is received and/or consumed. A breaker panel, such as panel 107, provides an interface between meter 106n and electrical wires 108 within residence 102n. Electrical wires 108 deliver power to outlets 110, switches 111 and other electric devices within residence 102n.

The power line topology illustrated in FIG. 1 may be used to deliver high-speed communications to residences 102a-n. In some implementations, power line communications modems or gateways 112a-n may be coupled to LV power lines 105 at meter 106a-n. PLC modems/gateways 112a-n may be used to transmit and receive data signals over MV/LV lines FIG. 11 illustrates data transmission with four RS-blocks according to one embodiment. 103/105. Such data signals may be used to support metering and power delivery applications (e.g., smart grid applications), communication systems, high speed Internet, telephony, video conferencing, and video delivery, to name a few. By transporting telecommunications and/or data signals over a power transmission network, there is no need to install new cabling to each subscriber 102a-n. Thus, by using existing electricity distribution systems to carry data signals, significant cost savings are possible.

An illustrative method for transmitting data over power lines may use a carrier signal having a frequency different from that of the power signal. The carrier signal may be modulated by the data, for example, using an OFDM technology or the like described, for example, G3-PL standard.

PLC modems or gateways 112a-n at residences 102a-n use the MV/LV power grid to carry data signals to and from PLC data concentrator or router 114 without requiring additional wiring. Concentrator 114 may be coupled to either MV line 103 or LV line 105. Modems or gateways 112a-n may support applications such as high-speed broadband Internet links, narrowband control applications, low bandwidth data collection applications, or the like. In a home environment, for example, modems or gateways 112a-n may further enable home and building automation in heat and air conditioning, lighting, and security. Also, PLC modems or gateways 112a-n may enable AC or DC charging of electric vehicles and other appliances. An example of an AC or DC charger is illustrated as PLC device 113. Outside the premises, power line communication networks may provide street lighting control and remote power meter data collection.

One or more PLC data concentrators or routers 114 may be coupled to control center 130 (e.g., a utility company) via network 120. Network 120 may include, for example, an IP-based network, the Internet, a cellular network, a WiFi network, a WiMax network, or the like. As such, control center 130 may be configured to collect power consumption and other types of relevant information from gateway(s) 112 and/or device(s) 113 through concentrator(s) 114. Additionally or alternatively, control center 130 may be configured to implement smart grid policies and other regulatory or commercial rules by communicating such rules to each gateway(s) 112 and/or device(s) 113 through concentrator(s) 114.

FIG. 2 is a block diagram of PLC device 113 according to some embodiments. As illustrated, AC interface 201 may be coupled to electrical wires 108a and 108b inside of premises 112n in a manner that allows PLC device 113 to switch the connection between wires 108a and 108b off using a switching circuit or the like. In other embodiments, however, AC interface 201 may be connected to a single wire 108 (i.e., without breaking wire 108 into wires 108a and 108b) and without providing such switching capabilities. In operation, AC interface 201 may allow PLC engine 202 to receive and transmit PLC signals over wires 108a-b. In some cases, PLC device 113 may be a PLC modem. Additionally or alternatively, PLC device 113 may be a part of a smart grid device (e.g., an AC or DC charger, a meter, etc.), an appliance, or a control module for other electrical elements located inside or outside of premises 112n (e.g., street lighting, etc.).

PLC engine 202 may be configured to transmit and/or receive PLC signals over wires 108a and/or 108b via AC interface 201 using a particular frequency band. In some embodiments, PLC engine 202 may be configured to transmit OFDM signals, although other types of modulation schemes may be used. As such, PLC engine 202 may include or otherwise be configured to communicate with metrology or monitoring circuits (not shown) that are in turn configured to measure power consumption characteristics of certain devices or appliances via wires 108, 108a, and/or 108b. PLC engine 202 may receive such power consumption information, encode it as one or more PLC signals, and transmit it over wires 108, 108a, and/or 108b to higher-level PLC devices (e.g., PLC gateways 112n, data aggregators 114, etc.) for further processing. Conversely, PLC engine 202 may receive instructions and/or other information from such higher-level PLC devices encoded in PLC signals, for example, to allow PLC engine 202 to select a particular frequency band in which to operate.

FIG. 3 is a block diagram of PLC gateway 112 according to some embodiments. As illustrated in this example, gateway engine 301 is coupled to meter interface 302, local communication interface 304, and frequency band usage database 304. Meter interface 302 is coupled to meter 106, and local communication interface 304 is coupled to one or more of a variety of PLC devices such as, for example, PLC device 113. Local communication interface 304 may provide a variety of communication protocols such as, for example, ZigBee, Bluetooth, Wi-Fi, Wi-Max, Ethernet, etc., which may enable gateway 112 to communicate with a wide variety of different devices and appliances. In operation, gateway engine 301 may be configured to collect communications from PLC device 113 and/or other devices, as well as meter 106, and serve as an interface between these various devices and PLC data concentrator 114. Gateway engine 301 may also be configured to allocate frequency bands to specific devices and/or to provide information to such devices that enable them to self-assign their own operating frequencies.

In some embodiments, PLC gateway 112 may be disposed within or near premises 102*n* and serve as a gateway to all PLC communications to and/or from premises 102*n*. In other embodiments, however, PLC gateway 112 may be absent and PLC devices 113 (as well as meter 106*n* and/or other appliances) may communicate directly with PLC data concentrator 114. When PLC gateway 112 is present, it may include database 304 with records of frequency bands currently used, for example, by various PLC devices 113 within premises 102*n*. An example of such a record may include, for instance, device identification information (e.g., serial number, device ID, etc.), application profile, device class, and/or currently allocated frequency band. As such, gateway engine 301 may use database 305 in assigning, allocating, or otherwise managing frequency bands assigned to its various PLC devices.

FIG. 4 is a block diagram of PLC data concentrator or router 114 according to some embodiments. Gateway interface 401 is coupled to data concentrator engine 402 and may be configured to communicate with one or more PLC gateways 112*a-n*. Network interface 403 is also coupled to data concentrator engine 402 and may be configured to communicate with network 120. In operation, data concentrator engine 402 may be used to collect information and data from multiple gateways 112*a-n* before forwarding the data to control center 130. In cases where PLC gateways 112*a-n* are absent, gateway interface 401 may be replaced with a meter and/or device interface (now shown) configured to communicate directly with meters 116*a-n*, PLC devices 113, and/or other appliances. Further, if PLC gateways 112*a-n* are absent, frequency usage database 404 may be configured to store records similar to those described above with respect to database 304.

FIG. 5 is a schematic block diagram illustrating one embodiment of a system 500 configured for point-to-point PLC. The system 500 may include a PLC transmitter 501 and a PLC receiver 502. For example, a PLC gateway 112 may be configured as the PLC transmitter 501 and a PLC device 113 may be configured as the PLC receiver 502. Alternatively, the PLC device 113 may be configured as the PLC transmitter 501 and the PLC gateway 112 may be configured as the PLC receiver 502. In still a further embodiment, the data concentrator 114 may be configured as either the PLC transmitter 501 or the PLC receiver 502 and configured in combination with a PLC gateway 112 or a PLC device 113 in a point-to-point system 500. In still a further embodiment, a plurality of PLC devices 113 may be configured to communicate directly in a point-to-point PLC system 500 as described in FIG. 5. Additionally, the substation 101 may be configured in a point-to-point system 500 as described above. On of ordinary skill in the art will recognize a variety of suitable configurations for the point-to-point PLC system 500 described in FIG. 5.

FIG. 6 is a block diagram of a circuit for generating PHY frames for a PLC network according to some embodiments, where the PHY frames have multiple Reed-Solomon encoded blocks. In some cases, one or more of the devices and/or apparatuses shown in FIGS. 1-5 may be implemented as shown in FIG. 6. In some embodiments, processor 602 may be a digital signal processor (DSP), an application specific integrated circuit (ASIC), a system-on-chip (SoC) circuit, a field-programmable gate array (FPGA), a microprocessor, a microcontroller, or the like. Processor 602 is coupled to one or more peripherals 604 and external memory 603. In some cases, external memory 603 may be used to store and/or maintain databases 304 and/or 404 shown in FIGS. 3 and 4. Further, processor 602 may include a driver for communicating signals to external memory 603 and another driver for communicating signals to peripherals 604. Power supply 601 provides supply voltages to processor 602 as well as one or more supply voltages to memory 603 and/or peripherals 604. In some embodiments, more than one instance of processor 602 may be included (and more than one external memory 603 may be included as well).

Peripherals 604 may include any desired circuitry, depending on the type of PLC system. For example, in an embodiment, peripherals 604 may implement local communication interface 303 and include devices for various types of wireless communication, such as Wi-Fi, ZigBee, Bluetooth, cellular, global positioning system, etc. Peripherals 604 may also include additional storage, including RAM storage, solid-state storage, or disk storage. In some cases, peripherals 604 may include user interface devices such as a display screen, including touch display screens or multi-touch display screens, keyboard or other input devices, microphones, speakers, etc.

External memory 603 may include any type of memory. For example, external memory 603 may include SRAM, non-volatile RAM (NVRAM, such as "flash" memory), and/or dynamic RAM (DRAM) such as synchronous DRAM (SDRAM), double data rate (DDR, DDR2, DDR3, etc.) SDRAM, DRAM, etc. External memory 603 may include one or more memory modules to which the memory devices are mounted, such as single inline memory modules (SIMMs), dual inline memory modules (DIMMs), etc.

The characteristics and parameters for a power line channel vary with frequency, location, time, and the type of equipment connected to the power line. The power line channel is very frequency selective. Lower frequency regions are especially sensitive to interference. Additional impediments on the power line channel include background noise, impulsive noise, narrow band interference, and channel group delays.

OFDM modulation can efficiently utilize the limited bandwidth of the power line channel and allows the use of advanced channel coding techniques. This facilitates very robust communications over a power line channel. The available bandwidth is divided into a number of subchannels that may be viewed as many independent PSK- or QAM-modulated carriers having different noninterfering (i.e., orthogonal) carrier frequencies. Convolutional and Reed-Solomon (RS) coding provide redundancy bits that allow the receiver to recover lost bits caused by noise. A time-frequency interleaving scheme is used to decrease the correlation of received noise at the input of the decoder.

FIG. 7 is a high level block diagram of an OFDM transmitter 700 for generating OFDM packets according to one embodiment, such as for circuits complying with the IEEE P1901.2 standards. Frame control header (FCH) bits 701 and data bits 702 are scrambled, encoded, and interleaved in a forward error correction (FEC) encoder 703. In one embodiment, the FEC encoder 703 in a power line communication system is composed of a Reed-Solomon (RS) encoder 704 followed by a convolutional encoder 705.

An OFDM signal is generated in a modulator 706 by performing inverse fast Fourier transform (IFFT) on the encoded bits. OFDM modulator 706 adds a cyclic prefix (CP) to the output of the IFFT block. The output of the OFDM modulator 706 is provided to power line circuit 707, such as a medium voltage (MV) or low voltage (LV) power line, thorough analog front end (AFE) 708 and coupling circuitry 709. The coupling circuitry may include, for example, line drivers, transformers, filters, and MV/LV couplers.

FIG. 8 illustrates a typical OFDM transmission packet 804 comprising a preamble 801, frame control header (FCH)

symbols 802, and data payload symbols 803. The preamble 801 typically consists of repeated sequences, such as a series of SYNCP and SYNCM symbols, which are used for automatic gain control adaptation, symbol synchronization, channel estimation, and initial phase reference estimation. FCH symbols 802 and data payload 803 are OFDM symbols with an associated cyclic prefix.

In one embodiment, FCH 802 includes a frame length (FL) bit field that indicates the number of data symbols 803. In the IEEE P1901.2 standard, for example, the frame length bit field is 9 bits long, which allows for up to 511 OFDM symbols per data payload 803.

The Reed Solomon encoder (704, FIG. 7) work on a fixed symbol work length, which is the size of the data words used in the RS-block. In the IEEE P1901.2 standard, for example, the RS symbol word length is fixed at 8 bits, which corresponds to for 255 bytes/octets. Table 1 illustrates the number of OFDM symbols required to support the largest RS-block size (e.g., 255 bytes) for different modulation types when transmission is done on the G3-FCC-72 band, for example. There is a mis-match between the number of OFDM symbols required to transmit the largest RS-block size (e.g., 19-228 symbols) and the maximum number of OFDM symbols possible per packet 803 transmission (e.g., 511 symbols). It is clear that per packet transmission, it is wasteful to transmit only one RS-block per packet 803.

TABLE 1

| Modulation Type | Number of OFDM Symbols per 255-byte RS-Block | Unused OFDM Symbols in a 511-symbol Packet |
| --- | --- | --- |
| ROBO | 228 | 283 |
| DBPSK | 57 | 454 |
| DQPSK | 28 | 483 |
| D8PSK | 19 | 492 |

In one embodiment, multiple RS-blocks are transmitted per packet transmission. Interleaving may be done on a per RS-block basis as illustrated in FIG. 9. Traditionally, multiple RS-blocks are handled only by the PHY layer and the Media Access Control (MAC) layer is unaware of the use of more than one RS-block. To the MAC, the use of multiple RS-blocks implies that a larger size packet may be transmitted as more bytes can be carried by the PHY when it uses multiple RS-blocks.

The MAC layer may be made aware of the presence of multiple RS-blocks. The PHY-MAC interface may be defined so that the MAC understands which bytes come from which RS-block within a received packet. This allows the receiver to know which RS-block failed when the CRC fails for only one of the RS-blocks, for example.

If the receiver can identify which RS-block failed, then it can tell the transmitter to retransmit only those portions of the data that were present in the failed RS-block.

FIG. 9 illustrates a MAC to PHY frame transmission for the case where a MAC header is present only in the first RS-block. Upon receiving a data frame from a higher layer, the MAC adds a MAC Header (MHR) 901 and a cyclic redundancy check (CRC) or other error-detecting code 902 to the MAC protocol data units (MPDUs) 903. The MAC then passes the frame 900 to the PHY layer. The PHY layer splits the received MAC frame 900 into different RS-blocks 904*a-c* and adds a PHY CRC 905*a-c* to each block 904*a-c*. The PHY then transmits the frame 906.

In the example of FIG. 9, the MHR 901 is present only in the first RS block 904*a*. In one embodiment, when the frame 906 is received, if one of the CRCs 905*a-c* is in error, then the PHY in the receiver will not decode the rest of the frame 906. This scheme saves power by preventing decoding of additional RS-blocks when errors are found in the packet.

FIG. 10 illustrates a MAC to PHY frame transmission for the case where the MAC splits the data into multiple RS-blocks. Upon receiving a data frame 1001 from a higher layer, the MAC splits the data 1001 into multiple blocks 1002*a-c* at the MAC layer. To each block it adds a MHR 1003*a-c* and a CRC 1004*a-c*. The MAC frame 1005 is then passed to the PHY specifying which RS-block should receive each MAC data block 1002*a-c* and related MHR and CRC. The PHY layer splits the received frame into different RS-blocks 1006*a-c* and transmits the PHY frame 1007 to a destination receiver.

FIG. 11 illustrates data transmission with four RS-blocks according to one embodiment. A PHY frame 1100 comprising a preamble 1101, header (FCH) 1102, and payload segments 1103-1106 is received at a PLC receiver. Each payload segment 1103-1106 has been separately interleaved. The PHY indicates payload segments 1103-1106 to the MAC, where each segment corresponding to a RS-block. The MAC may then determine the success/failure on a per RS-block basis.

The MAC may also determine the source address of the frame even if one block is successfully received. The MAC may then use this info to transmit selective Acknowledgement (ACK) frames to the transmitter, wherein the ACK frames may identify which RS-block was received in error and should be retransmitted. The transmitter may selectively transmit only those frames, thus helping to improve network performance.

In another embodiment, the MHR may be present only in the first block 1103 while the CRC may be present on all blocks. In this case, the MAC can still determine which RS-block was received with error. However, a selective ACK may be sent back to the source only if the first RS-block was received successfully.

Therefore, in one embodiment the MAC address, which uniquely identifies the destination, is only present in the first RS-block 1103. If a CRC check on the first RS-block fails, then the receiver does not need to decode the remaining RS-blocks 1104-1106 and can go into a power-save mode until the end of the frame 1100.

In another embodiment, the MAC address is present in all of the RS-blocks 1103-1106. This allows the receiver to decode each of the RS-blocks 1103-1106. If the CRC check fails for any one of the RS-blocks, then there are at least two possibilities.

In a first case, the receiver does need not send an ACK frame back to the transmitter. When the transmitter does not receive the ACK frame, the lack of an ACK frame implies that the data transmission has failed. In that case, the transmitter may resend the data packet automatically.

In a second case, the receiver sends an ACK or a Negative Acknowledgement (NACK) back to the transmitter and also indicates to the transmitter which one of the RS-blocks failed to pass CRC. Two additional fields may be introduced in the frame control header (FCH) to indicate that a retransmission of an RS-block is required.

A RSblock retransmission field is used to indicate whether a retransmission is required or not. The RSblock retransmission field may be a one-bit field in which "1" indicaters a retransmission is required, and a "0" indicates that no retransmission is required A RSblock address field is an address field that indicates which RS-block needs to be re-transmitted. For example, if up to four RS-blocks may be transmitted, then a two-bit RSblock address field can be used to identify the RS-block for retransmission. For example, 00b: indicates RS block 1 needs to be retransmitted;
01b: indicates RS block 2 needs to be retransmitted;
10b: indicates RS block 3 needs to be retransmitted; and
11b: indicates RS block 4 needs to be retransmitted.

Depending upon the embodiment, upon receiving a request for a RS-block retransmission, the transmitter may choose to transmit:

a) the whole packet again;
b) only the RS-block(s) that failed; or
c) the RS-block(s) that failed, and any new RS-blocks that are passed to it by the MAC.

In some embodiments, the transmitter may also choose a modulation scheme that has a better probability of success for the subsequent transmission or retransmission.

It will be understood that in various embodiments, the modules shown in FIGS. 1-7 may represent sets of software routines, logic functions, and/or data structures that are configured to perform specified operations. Although these modules are shown as distinct logical blocks, in other embodiments at least some of the operations performed by these modules may be combined in to fewer blocks. Conversely, any given one of the modules shown in FIGS. 1-7 may be implemented such that its operations are divided among two or more logical blocks. Moreover, although shown with a particular configuration, in other embodiments these various modules may be rearranged in other suitable ways.

Many of the operations described herein may be implemented in hardware, software, and/or firmware, and/or any combination thereof. When implemented in software, code segments perform the necessary tasks or operations. The program or code segments may be stored in a processor-readable, computer-readable, or machine-readable medium. The processor-readable, computer-readable, or machine-readable medium may include any device or medium that can store or transfer information. Examples of such a processor-readable medium include an electronic circuit, a semiconductor memory device, a flash memory, a ROM, an erasable ROM (EROM), a floppy diskette, a compact disk, an optical disk, a hard disk, a fiber optic medium, etc.

Software code segments may be stored in any volatile or non-volatile storage device, such as a hard drive, flash memory, solid state memory, optical disk, CD, DVD, computer program product, or other memory device, that provides tangible computer-readable or machine-readable storage for a processor or a middleware container service. In other embodiments, the memory may be a virtualization of several physical storage devices, wherein the physical storage devices are of the same or different kinds. The code segments may be downloaded or transferred from storage to a processor or container via an internal bus, another computer network, such as the Internet or an intranet, or via other wired or wireless networks.

Many modifications and other embodiments of the invention(s) will come to mind to one skilled in the art to which the invention(s) pertain having the benefit of the teachings presented in the foregoing descriptions, and the associated drawings. Therefore, it is to be understood that the invention(s) are not to be limited to the specific embodiments disclosed. Although specific terms are employed herein, they are used in a generic and descriptive sense only and not for purposes of limitation.

What is claimed is:

1. A method, comprising:
   performing, by a power line communication (PLC) transmitter device,
   generating a PHY frame comprising two or more Reed-Solomon encoded blocks;
   transmitting the PHY frame on a PLC network to a receiver;
   receiving a media access control (MAC) frame at a PHY layer of the PLC transmitter from a MAC layer; and
   dividing the MAC frame into the two or more Reed-Solomon encoded blocks at the PHY layer, wherein a MAC header from the MAC frame is present in each of the two or more Reed-Solomon encoded blocks.

2. The method of claim 1, further comprising:
   adding a PHY error-detecting code to each of the two or more Reed-Solomon encoded blocks.

3. A method, comprising:
   performing, by a power line communication (PLC) transmitter device:
   receiving a data frame at a media access control (MAC) layer from a higher layer of the PLC transmitter;
   dividing the data frame into two or more MAC data blocks;
   adding a MAC header and an error-detecting code to each of the two or more MAC data blocks; and
   creating the two or more Reed-Solomon encoded blocks from the two or more MAC data blocks.

4. A power line communication (PLC) transmitter device coupled to a PLC network, comprising:
   a forward error correction (FEC) encoder configured to receive MAC data from a media access control (MAC) layer, the FEC encoder configured to:
   generate Reed-Solomon encoded blocks from segments of the MAC data using a Reed-Solomon encoder;
   combine two or more of the Reed-Solomon blocks into a PHY frame for transmission to a PLC receiver;
   receive a data frame at a media access control (MAC) layer from a higher layer of the PLC transmitter;
   divide the data frame into two or more MAC data blocks;
   add a MAC header and an error-detecting code to each of the two or more MAC data blocks; and
   create the two or more Reed-Solomon encoded blocks from the two or more MAC data blocks.

5. The PLC transmitter of claim 4, further configured to:
   receive MAC data at a PHY layer from a MAC layer; and
   divide the MAC frame into the two or more Reed-Solomon encoded blocks at the PHY layer.

6. The PLC transmitter of claim 5, further configured to:
   adding a PHY error-detecting code to each of the two or more Reed-Solomon encoded blocks.

* * * * *